United States Patent
Park et al.

(10) Patent No.: US 7,460,579 B2
(45) Date of Patent: Dec. 2, 2008

(54) MULTI-WAVELENGTH SEMICONDUCTOR LASER DEVICE

(75) Inventors: Jong Ik Park, Seoul (KR); Yu Seung Kim, Kyungki-do (KR); Ki Won Moon, Kyungki-do (KR); Hye Ran Oh, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 129 days.

(21) Appl. No.: 11/159,350

(22) Filed: Jun. 23, 2005

(65) Prior Publication Data

US 2006/0093007 A1 May 4, 2006

(30) Foreign Application Priority Data

Oct. 29, 2004 (KR) .................. 10-2004-0087199

(51) Int. Cl.
*H01S 5/00* (2006.01)
(52) U.S. Cl. ............... 372/121; 372/50.12; 372/50.1
(58) Field of Classification Search ............ 370/50.121, 370/50.12, 50.1, 23, 33
See application file for complete search history.

(56) References Cited

U.S. PATENT DOCUMENTS

| | | | | |
|---|---|---|---|---|
| 4,833,687 A | | 5/1989 | Hirata | |
| 5,033,053 A | * | 7/1991 | Shimizu et al. | 372/50.121 |
| 5,465,263 A | * | 11/1995 | Bour et al. | 372/23 |
| 6,456,429 B1 | * | 9/2002 | Wu | 359/344 |
| 6,618,420 B1 | * | 9/2003 | Gen-Ei et al. | 372/50.1 |
| 6,628,689 B2 | * | 9/2003 | Okada et al. | 372/49.01 |
| 6,643,310 B2 | | 11/2003 | Nemoto | |
| 2005/0105577 A1 | * | 5/2005 | Fukuhisa et al. | 372/50 |

* cited by examiner

*Primary Examiner*—Minsun Harvey
*Assistant Examiner*—Kinam Park
(74) *Attorney, Agent, or Firm*—McDermott Will & Emery LLP

(57) ABSTRACT

A semiconductor laser device comprises: a substrate having a top surface divided into a first region and a second region; a high-output LD including a first conductivity-type clad layer, an active layer, and a second conductivity-type clad layer including an upper portion having a first ridge structure, sequentially formed on the first region of the substrate; and a low-output LD including a first conductivity-type clad layer, an active layer, and a second conductivity-type clad layer including an upper portion having a second ridge structure, sequentially formed on the second region of the substrate, wherein the first and second ridge structures are formed in such a manner that they are extended to both ends opposed to each other, the first ridge structure is bent at two or more bending positions, and the second ridge structure is rectilinear.

9 Claims, 5 Drawing Sheets

MULTI-WAVELENGTH SEMICONDUCTOR LASER DEVICE

RELATED APPLICATIONS

The present application is based on, and claims priority from, Korean Application Number 2004-87199, filed Oct. 29, 2004, the disclosure of which is incorporated by reference herein in its entirety.

BACKGROUND OF THE INVENTION

1. Field of the Invention

The present invention relates to a semiconductor laser device, and more particularly to a multi-wavelength semiconductor laser device capable of reducing operation current of a low-output semiconductor laser diode while providing a sufficient resonant length to a high-output semiconductor laser diode.

2. Description of the Related Art

A general semiconductor laser device comprises p-type and n-type clad layers for current injection, and an active layer disposed between the clad layers in which induced emission of photons substantially occurs. Since an upper clad layer of the general semiconductor laser device is formed into a ridge structure, current injection efficiency is improved and at the same time the ridge structure serves as a waveguide for the light emitted from the active layer.

With the recent distribution of CD-RWs and DVD-RWs, multi-wavelength semiconductor laser devices capable of oscillating laser light of two or more different wavelengths have been required in the art. Particularly, multi-wavelength semiconductor laser devices, including two-wavelength semiconductor laser devices, are increasingly employed as light sources for operating both CD players having a relatively low data density and DVD players having a relatively high data density. For example, a multi-wavelength semiconductor laser device is produced by integrating a semiconductor laser diode (hereinafter, referred to simply as an "LD") emitting light at 780 nm and a semiconductor LD emitting light at 650 nm on a single substrate. In such multi-wavelength semiconductor laser devices, maximum outputs of laser light at each wavelength are different.

According to a conventional multi-wavelength semiconductor laser device, since waveguides for light at each wavelength have a rectilinear structure (that is, a straight structure), the resonant length of an LD requiring a low output is identical to that of an LD requiring a high output. Accordingly, there is a problem in that an increase in the operation current of the LD requiring a low output is inevitable.

FIGS. 1a and 1b are a cross-sectional view and a plan view of a conventional multi-wavelength semiconductor laser device, respectively.

Referring to FIGS. 1a and 1b, the conventional multi-wavelength (two-wavelength herein) semiconductor laser device comprises a first LD A and a second LD B formed on one substrate 11. The first LD A and the second LD B are electrically and optically separated from each other by a device separation region I, and are configured in such a manner that they emit light at first and second wavelengths, which have different outputs. For example, the first LD is made of an AlGaInP-based semiconductor and emits high-output laser light at 650 nm, while the second LD is made of an AlGaAs-based semiconductor and emits low-output laser light at 780 nm.

The first LD A includes a first conductivity-type clad layer 12a, an active layer 13a, a second conductivity-type upper clad layer 14a, and an etch stop layer 15a sequentially formed on the substrate 11. Like the first LD A, the second LD B includes a first conductivity-type clad layer 12b, an active layer 13b, a second conductivity-type upper clad layer 14b, and an etch stop layer 15b sequentially formed on the substrate 11. In addition, first and second ridge structures 30a and 30b are formed on the respective laminates. The first ridge structure 30a includes a second conductivity-type upper clad layer 16a, a second conductivity-type cap layer 17a, and a second conductivity-type contact layer 18a formed on the etch stop layer 15a. A current blocking layer 21a for blocking current dispersion is formed around the first ridge structure 30a. Likewise, the second ridge structure 30b includes a second conductivity-type upper clad layer 16b, a second conductivity-type cap layer 17b, and a second conductivity-type contact layer 18b formed on the etch stop layer 15b. A current blocking layer 21b for blocking current dispersion is formed around the second ridge structure 30b.

As shown in FIG. 1b, the ridge structures 30a and 30b, serving as waveguides for laser light, of the respective first and second LDs A and B have a rectilinear structure. Accordingly, the first and second LDs A and B have the same resonant length L. At this time, unfavorable phenomena, such as gain saturation and catastrophic optical damage (COD), may take place in the high-output LD due to increased current density. To prevent these phenomena, the high-output LD (i.e. the first LD) is required to have a large resonant length of at least 600 μm. However, such a large resonant length L of the first LD A is applied to the low-output LD (i.e. the second LD B). The unnecessarily large resonant length of the low-output LD B causes a higher operation current than required to operate the low-output LD.

Further, when the resonant length L is increased in order to prevent the occurrence of COD in the high-output LD, the number of multi-wavelength semiconductor laser devices capable of being produced on a single wafer is decreased. Taking into consideration these problems, a process wherein the width W of a semiconductor laser device is reduced is currently employed. However, since the length L remains unchanged despite the small width of the semiconductor laser device, the productivity is not greatly improved. Moreover, process margins are worsened in subsequent steps and mechanical damage tends to occur due to the small width W.

SUMMARY OF THE INVENTION

Therefore, the present invention has been made in view of the above problems, and it is an object of the present invention to provide a multi-wavelength semiconductor laser diode comprising a high-output LD and a low-output LD integrated on a single substrate in which the low-output LD has a reduced operation current while maintaining a constant effective resonant length, and the overall size of the device is minimized, improving productivity of the device.

In order to accomplish the above object of the present invention, there is provided a multi-wavelength semiconductor laser device, comprising: a substrate having a top surface divided into a first region and a second region; a high-output LD including a first conductivity-type clad layer, an active layer, and a second conductivity-type clad layer including an upper portion having a first ridge structure, sequentially formed on the first region of the substrate; and a low-output LD including a first conductivity-type clad layer, an active layer, and a second conductivity-type clad layer including an upper portion having a second ridge structure, sequentially formed on the second region of the substrate, wherein the first and second ridge structures are formed in such a manner that they are extended to both ends opposed to each other, the first ridge structure is bent at two or more bending positions, and the second ridge structure is rectilinear.

The bending angles of the bent parts are preferably within the range of 20° to 160°. Either one or both sides of at least one of the bent parts may be a curve. The first ridge structure may have parts overlapped by the bent parts. At this time, the distance between the overlapped parts is preferably not smaller than 10 μm in order to ensure sufficient process margins upon formation of the first ridge structure.

According to one embodiment of the present invention, a slit-shaped mirror is formed in the first conductivity-type clad layer, the active layer and the second conductivity-type clad layer at the outer side of the bent parts in the high-output LD. In this case, the bottom face of the first ridge structure adjacent to the mirror may have a smaller width than the other bottom faces of the first ridge structure. A dielectric film may be formed on the cross sections of the slit-shaped mirror in order to prevent oxidation by air or invasion of impurities.

Further, the second conductivity-type clad layer of the high-output LD comprises a second conductivity-type lower clad layer formed below the first ridge structure and a second conductivity-type upper clad layer formed in the first ridge structure. The high-output LD may further include an etch stop layer formed between the second conductivity-type lower and upper clad layers. The etch stop layer may be formed only just below the first ridge structure.

The present invention provides an improved multi-wavelength semiconductor laser device comprising a high-output LD and a low-output LD integrated on one substrate wherein the high-output LD has a sufficient resonant length, the low-output LD has a reduced operation current, and the degree of integration of the device is increased, resulting in improved productivity of the device. To this end, the ridge waveguide of the high-output LD is bent at two or more bending positions, and the ridge waveguide of the low-output LD is rectilinear.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1A:
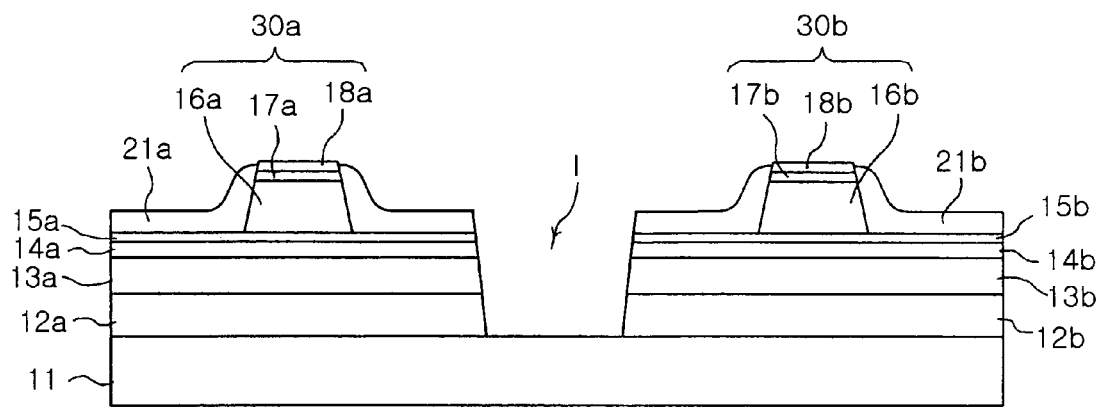
FIGS. 1a and 1b are a cross-sectional view and a plan view of a conventional multi-wavelength semiconductor laser device, respectively.
Figure 1B:
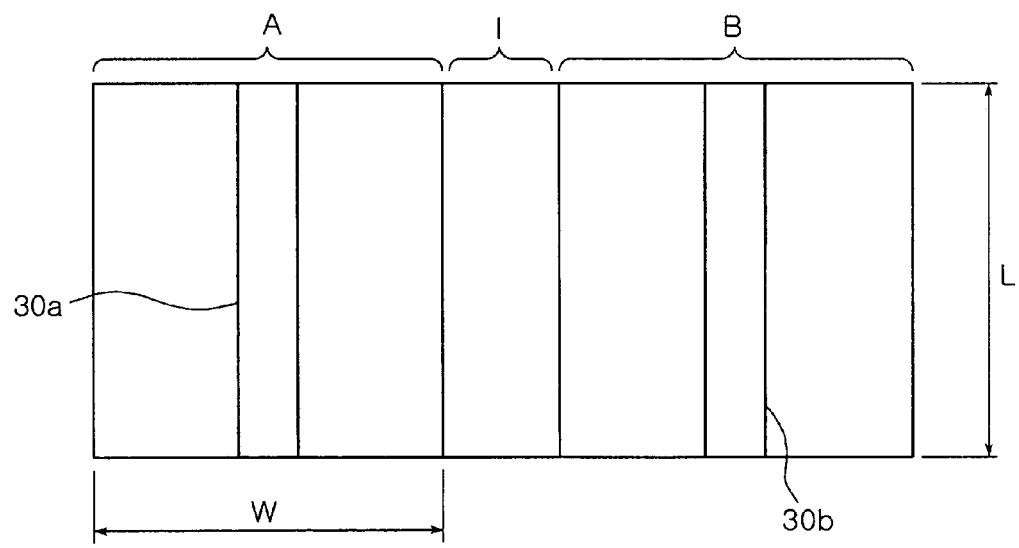

Detailed description will be made of embodiments of the present invention with reference to the accompanying drawings. However, various modifications to the embodiments of the present invention may easily be made, and the scope of the present invention is not limited by the following embodiments. These embodiments are provided to those skilled in the art for a better understanding of the present invention. In the drawings, the shape and size of elements may be exaggerated for the purpose of clarity, and the same elements are denoted by the same reference numerals even though they are depicted in different drawings.

Figure 2:
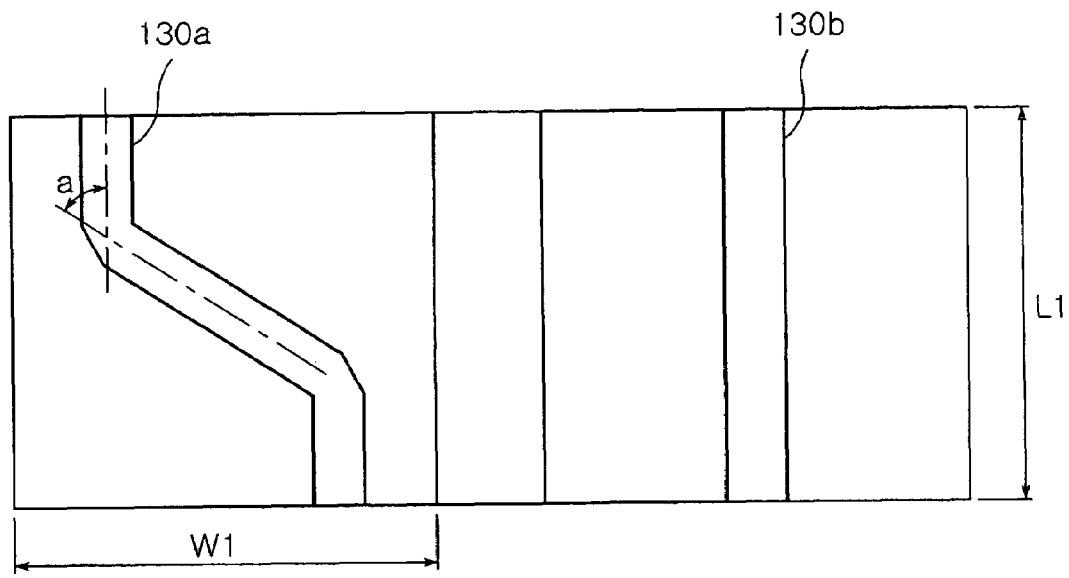
FIG. 2 is a plan view of a multi-wavelength semiconductor laser device according one embodiment of the present invention.

FIG. 2 is a plan view of a two-wavelength semiconductor laser device according one embodiment of the present invention. Referring to FIG. 2, the left and right regions correspond to a high-output LD and a low-output LD, respectively. A ridge structure 130a bent at two bending positions is formed in the high-output LD, and a ridge structure 130b having no bent part is rectilinearly formed in the low-output LD (that is, the ridge structure 130b is in a straight line). Accordingly, the length of the ridge structure 130a of the high-output LD is larger than that of the ridge structure 130b of the low-output LD. Since the ridge structures 130a and 13b act as waveguides for laser light emitted from an underlying active layer, the length of the ridge structures is consistent with the resonant length of the respective semiconductor laser diodes. Consequently, the high-output LD has a larger resonant length than the low-output LD.

The ridge structure 130a of the high-output LD preferably has a bending angle (a) of 20° to 160° between the bent parts. When the bending angle is smaller than 20°, it is difficult to ensure a sufficient resonant length of the high-output LD. Meanwhile, when the bending angle is larger than 160°, disadvantageously, process margins for precise formation of a pattern of the ridge structure 130a cannot be ensured. The bent parts may be curved at a constant curvature at either one or both sides.

As shown in FIG. 2, since the ridge structure 130a of the high-output LD has two bent parts, the resonant length of the high-output LD can be sufficiently large and thus problems, such as COD, caused during high-output operation can be solved. In contrast, the ridge structure 130b of the low-output LD is rectilinearly formed without any bent part so that it can be designed to have an optimum resonant length. Accordingly, the rectilinear ridge structure 130b reduces the operation current of the low-output LD.

Furthermore, since the ridge structure 130a of the high-output LD is bent, the entire length L1 of the semiconductor laser device is small. That is, the resonant length of the high-output LD required for high-output operation can be sufficiently guaranteed, and at the same time, the overall length of the semiconductor laser device can be considerably reduced when compared to that of conventional semiconductor laser devices. Accordingly, the number of devices that can be produced per unit wafer is increased. Moreover, since sufficient yield of devices can be achieved without the need of reducing the width W1 of the unit LD, deterioration of process margins, which is a problem of conventional semiconductor laser devices, can be prevented.

Figure 3:
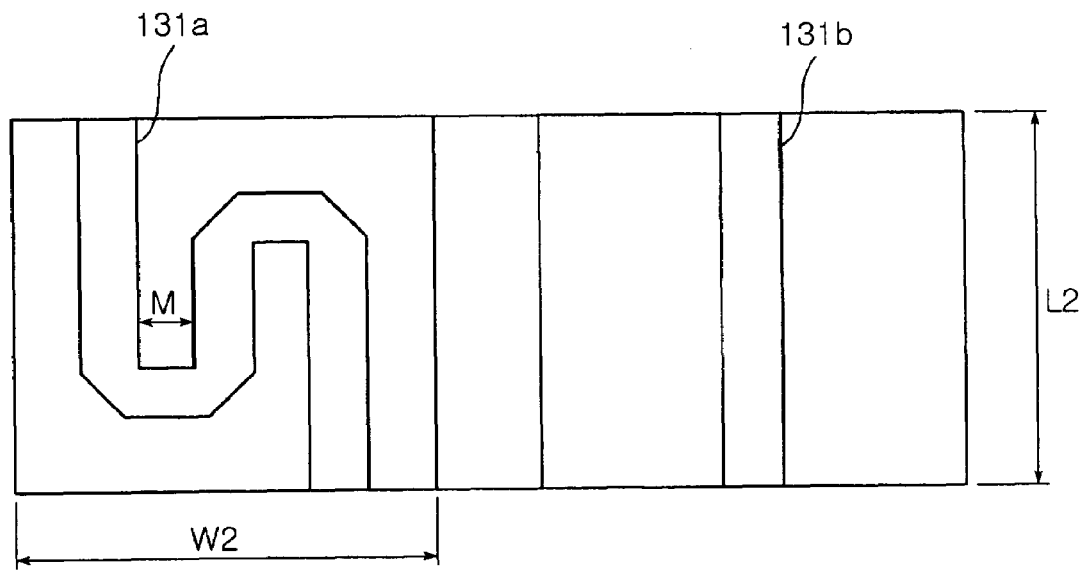
FIG. 3 is a plan view of a multi-wavelength semiconductor laser device according another embodiment of the present invention.

FIG. 3 is a plan view of a multi-wavelength semiconductor laser device according another embodiment of the present invention. The multi-wavelength semiconductor laser device shown in FIG. 3 is identical to that shown in FIG. 2, except that a ridge structure 131a of a high-output LD has parts overlapped by bent parts. A ridge structure 131b of a low-output LD is rectilinear, but the ridge structure 131*a* has two or more bent parts. Accordingly, the semiconductor laser device can reduce the operation current of the low-output LD while ensuring a sufficient resonant length of the high-output LD. In addition, since the semiconductor laser device can reduce the entire length L2 of the device without reducing the width W2 of the device, it can prevent deterioration of process margins, leading to improved productivity of the device.

As shown in FIG. 3, however, since the ridge structure 131*a* of the high-output LD has parts overlapped by the bent parts, the distance between the overlapped parts may be problematic. That is, when the distance M is too small, processes for realizing the small distance is substantially difficult, sufficient process margins cannot be guaranteed upon patterning the ridge structure, and precise etching cannot be achieved. In view of these difficulties, the distance M is preferably set to 10 μm or more.

Figure 4A:
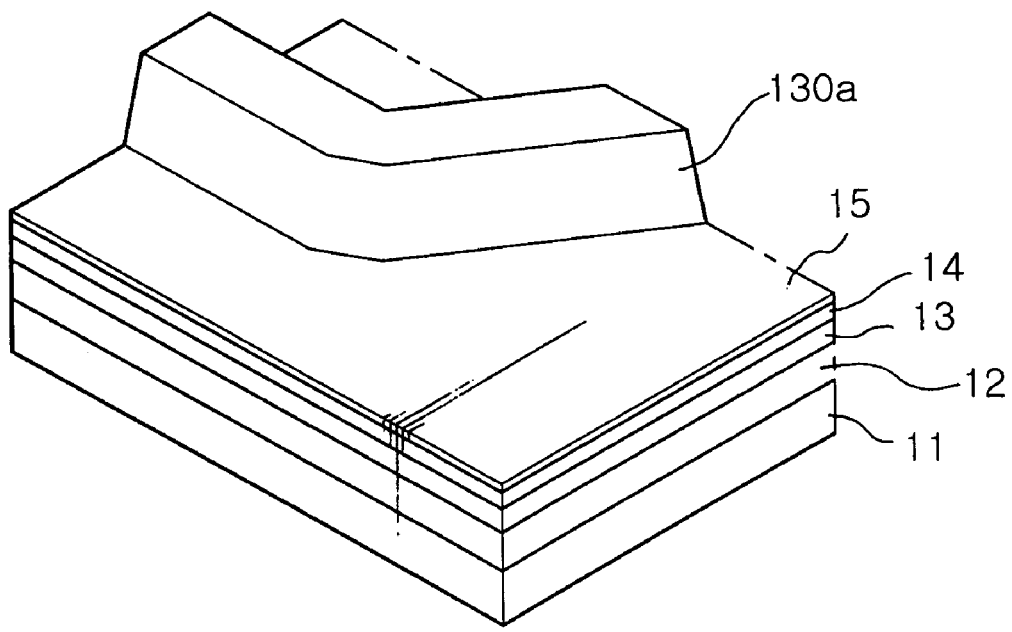
FIGS. 4a and 4b are a partial perspective view and a partial plan view of a semiconductor laser device according to another embodiment of the present invention, respectively.
Figure 4B:
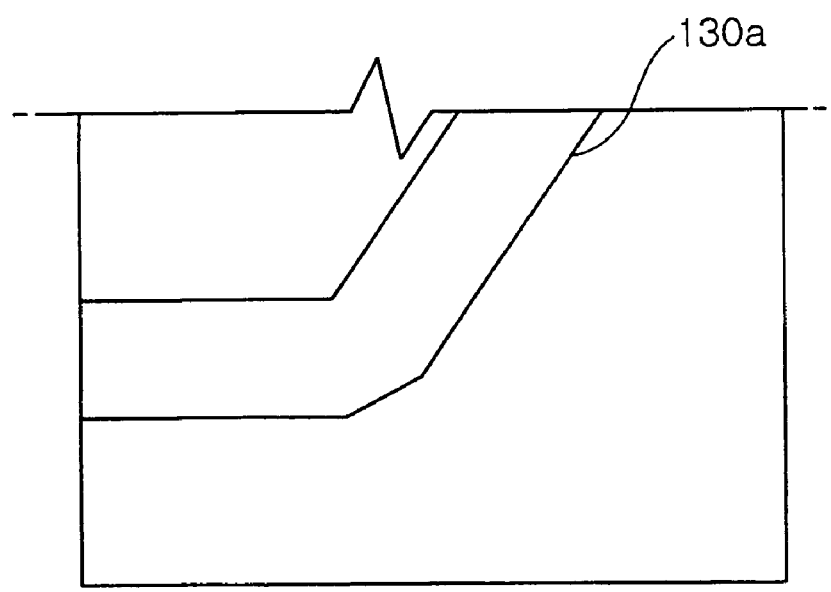

FIGS. 4*a* and 4*b* are a partial perspective view and a partial plan view of a semiconductor laser device according to another embodiment of the present invention, respectively. FIGS. 4*a* and 4*b* show a substantial shape of bent parts formed in a ridge structure of a high-output LD.

Referring to FIG. 4*a*, an n-type (first conductivity-type) clad layer 12, an active layer 13, a p-type (second conductivity-type) lower clad layer 14, and an etch stop layer 15 are sequentially formed on a substrate 11. A ridge structure 130*a* having two bent parts is formed on the laminate. A p-type (second conductivity-type) upper clad layer is included in the ridge structure 130*a*. The etch stop layer 15 remains on other regions except for the region just below the ridge structure 130*a*. Upon etching for formation of the ridge structure 130*a*, the etch stop layer 15 may be removed, leaving only the region just below the ridge structure 130*a*.

In another embodiment of the semiconductor laser device, a slit-shaped mirror is formed at the outer side of the ridge structure 130*a* of the high-output LD by dry etching. The mirror assists in the propagation of laser light reflected in the bending position along the ridge waveguide.

Figure 5A:
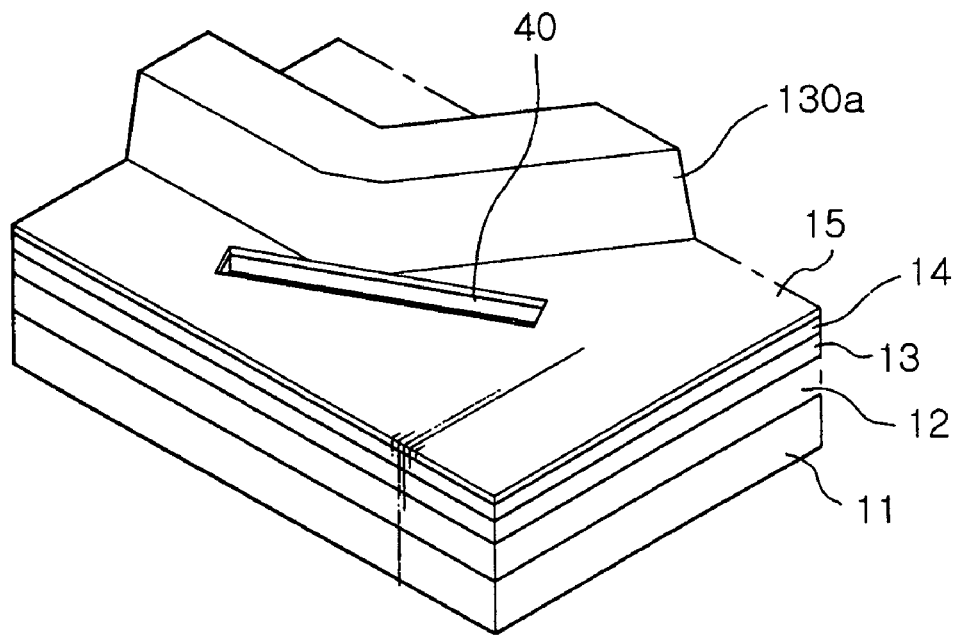
FIGS. 5a and 5b are a partial perspective view and a partial plan view of a semiconductor laser device according to another embodiment of the present invention, respectively.
Figure 5B:
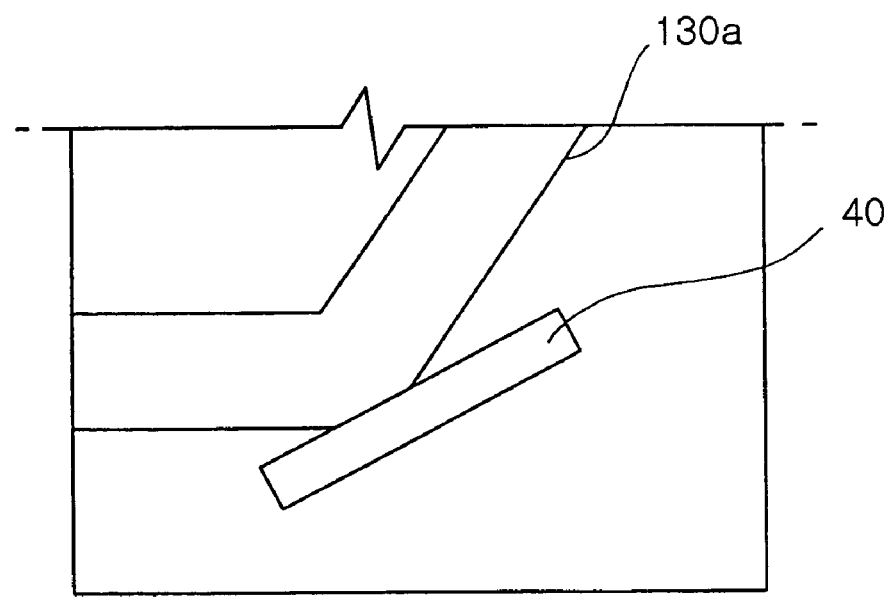

FIGS. 5*a* and 5*b* are a partial perspective view and a partial plan view of a two-wavelength semiconductor laser device according to another embodiment of the present invention, respectively. Referring to FIGS. 5*a* and 5*b*, a slit-shaped mirror 40 is formed at the outer side of a ridge structure 130*a* of a high-output LD. Specifically, the mirror 40 is formed by selectively dry etching an etch stop layer 15, a p-type lower clad layer 14*a*, an active layer 12 and an n-type clad layer 11 at the outer side of the ridge structure 130*a*.

The slit-shaped mirror 40 formed at the outer side of the bent parts enables reflection of laser light at higher precision along the ridge waveguide in the bent parts. This action of the mirror 40 is the same as that of a glass mirror reflecting and bending the propagation path at a constant angle. Accordingly, the mirror 40 can be designed in such a way that the position and shape of the mirror 40 is the same as those of a glass mirror capable of reflecting laser light propagating along the ridge waveguide in the bending position. As shown in FIG. 5*b*, the mirror 40 is arranged at the outer side of the bent parts, forming the same angles with straight lines connected to the respective bent parts, and has an extended rectangular slit shape.

Once the mirror 40 is formed, the cross sections exposed by the mirror 40, i.e. portions of the etch stop layer 15, the p-type lower clad layer 14, the active layer 13, and the n-type clad layer, may be oxidized in air or invaded by impurities. For these reasons, a dielectric film can be formed on the cross sections of the mirror 40 in order to solve these problems and protect the cross sections of the mirror 40.

Figure 6A:
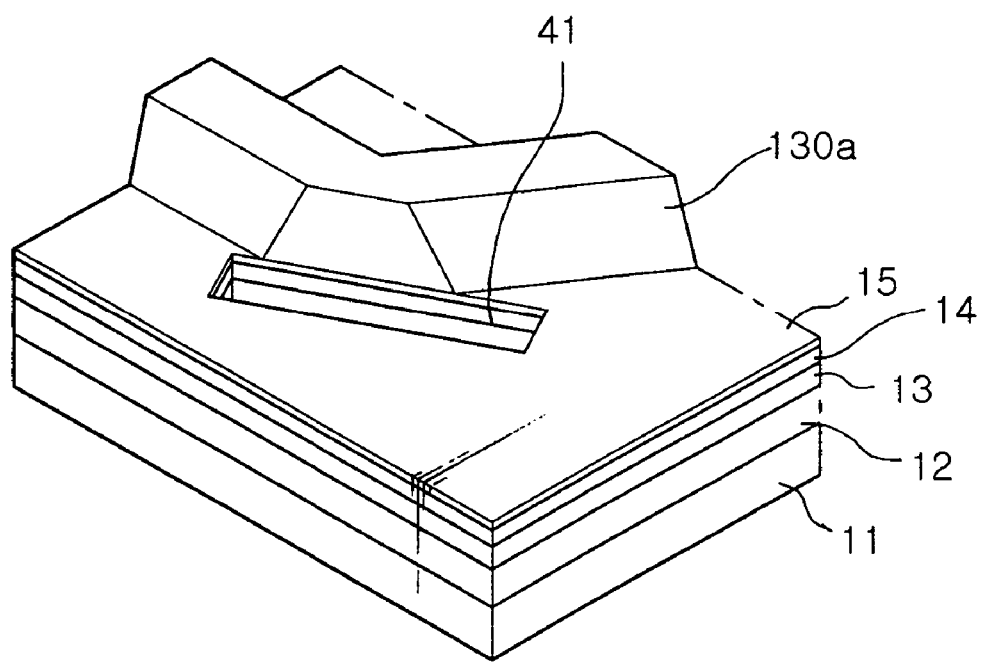
FIGS. 6a and 6b are a partial perspective view and a partial plan view of a semiconductor laser device according to another embodiment of the present invention, respectively.
Figure 6B:
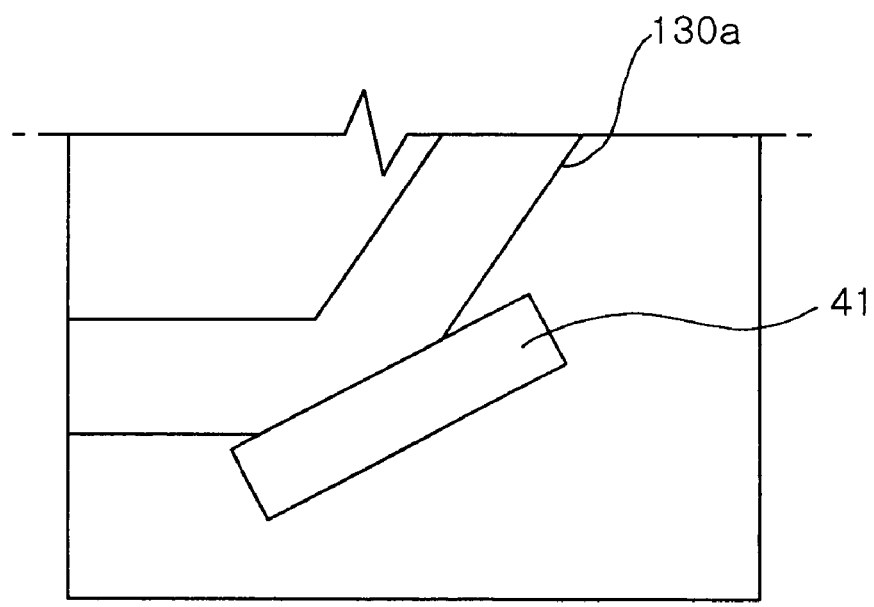

FIGS. 6*a* and 6*b* are a partial perspective view and a partial plan view of a semiconductor laser device according to another embodiment of the present invention, respectively. The semiconductor laser device shown in FIGS. 6*a* and 6*b* has the same structure as that shown in FIGS. 5*a* and 5*b*, except that the bottom face of a first ridge structure adjacent to a mirror 41 has a smaller width than the other bottom faces of the first ridge structure. Accordingly, the mirror 41 in a slit shape is formed at a position adjacent to one of bent parts at the outer side of one of the bent parts. In addition, a dielectric film is formed on the cross sections of the mirror 41 such that the oxidation of the cross sections in air is prevented and the invasion of impurities can be inhibited.

The semiconductor laser device shown in FIGS. 6*a* and 6*b* is characterized in that the width of the bottom face of the ridge structure 130 adjacent to the mirror 41 is smaller than that of the other bottom faces of the ridge structure 130. To this end, a portion of the bent part of the ridge structure is etched, upon etching for formation of the mirror 41, along with an etch stop layer 15, a p-type lower clad layer 14, an active layer 13, and an n-type clad layer 12. In this manner, upon patterning for formation of the mirror 41 at the outer side of the bent parts, process margins can be more stably ensured.

Although the present invention has been described herein with reference to the foregoing embodiments and the accompanying drawings, the scope of the invention is defined by the claims that follow. Accordingly, those skilled in the art will appreciate that various substitutions, modifications and changes are possible, without departing from the technical spirit of the present invention as disclosed in the accompanying claims.

As apparent from the above description, the present invention provides a multi-wavelength semiconductor laser device comprising high-output and low-output LDs integrated on one substrate wherein a ridge structure of the high-output LD has two or more bent parts and a ridge structure of the low-output LD is rectilinear. According to the multi-wavelength semiconductor laser device of the present invention, a sufficient resonant length can be provided to the high-output LD such that an excessive current density is inhibited, and operation current of the low-output LD can be reduced.

In addition, according to the present invention, since the size of the device can be reduced while maintaining constant effective resonant lengths of the high-output and low-output LDs, the number of devices that can be produced per unit wafer is increased, leading to an improvement in productivity.

What is claimed is:

1. A multi-wavelength semiconductor laser device, comprising:
   a substrate having a top surface divided into a first region and a second region;
   a high-output LD including a first conductivity-type clad layer, an active layer, and a second conductivity-type clad layer including an upper portion having a first ridge structure, sequentially formed on the first region of the substrate; and
   a low-output LD including a first conductivity-type clad layer, an active layer, and a second conductivity-type clad layer including an upper portion having a second ridge structure, sequentially formed on the second region of the substrate,
   wherein the first and second ridge structures are formed in such a manner that they are extended to both ends opposed to each other, the first ridge structure is bent at two or more bending positions, and the second ridge structure is rectilinear; and wherein the semiconductor laser device further comprises a slit-shaped mirror formed in the first conductivity-type clad layer, the active layer and the second conductivity-type clad layer at the outer side of the bent parts in the high-output LD.

2. The semiconductor laser device according to claim 1, wherein the bent parts of the first ridge structure form an angle of 20° to 160°.

3. The semiconductor laser device according to claim 1, wherein one or both sides of at least one of the bent parts are curves.

4. The semiconductor laser device according to claim 1, wherein the first ridge structure has parts overlapped by the bent parts.

5. The semiconductor laser device according to claim 4, wherein the distance between the overlapped parts is not smaller than 10 μm.

6. The semiconductor laser device according to claim 1, wherein the bottom face of the first ridge structure adjacent to the mirror has a smaller width than the other bottom faces of the first ridge structure.

7. The semiconductor laser device according to claim 1, wherein a dielectric film is formed on the cross sections of the mirror.

8. The semiconductor laser device according to claim 1 wherein the second conductivity-type clad layer of the high-output LD comprises a second conductivity-type lower clad layer formed below the first ridge structure and a second conductivity-type upper clad layer formed in the first ridge structure; and the high-output LD further includes an etch stop layer formed between the second conductivity-type lower and upper clad layers.

9. The semiconductor laser device according to claim 8, wherein the etch stop layer is formed only just below the first ridge structure.

* * * * *